United States Patent [19]

Smith

[11] 3,929,488

[45] Dec. 30, 1975

[54] LIGHT SENSITIVE DIAZO COMPOSITION WITH AZO DYE FORMED FROM A DIAZONIUM SALT AND A NOVOLAK RESIN

[75] Inventor: Peter John Smith, Seacroft, England

[73] Assignee: Howson-Algraphy Limited, Kent, England

[22] Filed: June 25, 1974

[21] Appl. No.: 483,027

Related U.S. Application Data

[63] Continuation-in-part of Ser. No. 262,652, June 14, 1972, abandoned.

[30] Foreign Application Priority Data

June 17, 1971 United Kingdom.............. 28574/71

[52] U.S. Cl....................... 96/91 R; 96/33; 96/36.3; 96/49; 96/75; 96/91 D; 96/115 R

[51] Int. Cl.².... G03F 7/08; G03C 1/54; G03C 1/60

[58] Field of Search............. 96/91 R, 91 D, 75, 49, 96/33, 36.3, 115 R

[56] References Cited

UNITED STATES PATENTS

| | | | |
|---|---|---|---|
| 2,551,133 | 5/1951 | Jennings et al. | 96/91 R |
| 3,046,115 | 7/1962 | Schmidt et al. | 96/91 D X |
| 3,046,117 | 7/1962 | Sus | 96/91 D X |
| 3,046,118 | 7/1962 | Schmidt | 96/91 D X |
| 3,199,981 | 8/1965 | Sus et al. | 96/91 R |
| 3,211,553 | 10/1965 | Ito | 96/75 |
| 3,219,447 | 11/1965 | Neugebauer et al. | 96/75 X |
| 3,288,608 | 11/1966 | Coutaud et al. | 96/91 D |
| 3,669,658 | 6/1972 | Yonezawa et al. | 96/91 D X |
| 3,674,495 | 7/1972 | Esaka | 96/91 D |
| 3,679,419 | 7/1972 | Gillich | 96/91 R |

FOREIGN PATENTS OR APPLICATIONS

| | | | |
|---|---|---|---|
| 1,039,475 | 8/1966 | United Kingdom | 96/91 D |
| 1,041,463 | 9/1966 | United Kingdom | 96/91 R |
| 1,170,458 | 11/1969 | United Kingdom | 96/91 D |

OTHER PUBLICATIONS

Kosar, J., "Light-Sensitive Systems", Wiley & Sons, 1965, pp. 215–217, 220 and 230–231.

Dinaburg, M. S., "Photosensitive Diazo Compounds", 1964, The Focal Press, pp. 182–191.

*Primary Examiner*—Charles L. Bowers, Jr.
*Attorney, Agent, or Firm*—Nichol M. Sandoe

[57] ABSTRACT

A light-sensitive positive-working composition for printing plate manufacture comprises, in admixture, a diazonium salt of a strong acid, a novolak resin and an azo-dye which undergoes a colour change in the presence of the light decomposition products of the diazonium salt. The azo-dye is obtained by coupling together a diazonium salt and a novolak resin in alkaline conditions and may be formed in situ. Optionally, the material also includes an ortho-quinone diazide.

6 Claims, No Drawings

LIGHT SENSITIVE DIAZO COMPOSITION WITH AZO DYE FORMED FROM A DIAZONIUM SALT AND A NOVOLAK RESIN

This Application is a continuation-in-part of my application Ser. No. 262,652 dated June 14, 1972, now abandoned.

This invention relates to light-sensitive positive-working compositions and is concerned with such materials which are suitable for, for example, the production of printing plates by photo-mechanical methods.

Photo-mechanical methods of preparing printing plates and the like comprise producing a light-sensitive plate by applying a light-sensitive composition to a suitable support, e.g. of anodised aluminium, image-wise exposing the light-sensitive plate so that the light-struck areas of the composition are more soluble than the non-light-struck areas of the composition in a solvent, and then developing the image-wise exposed plate with the solvent to selectively remove the more soluble light-struck areas. Thus, the image areas are formed by the composition and the non-image areas are formed by the surface of the support material from which the composition has been removed.

In these procedures it is desirable for a colour change to take place in the light-struck areas so as to render them visible: this is especially the case in step- and repeat work where it is necessary to align successive images on the plate. In some cases the colour change inherent in the light-sensitive system used (e.g. in azide sensitised layers) may be sufficient in itself. In other cases, although some colour change occurs on image-wise exposure to light, this is rarely sufficient in practice to enable the image to be visibly inspected especially in the yellow safelight of the work area. This is particularly the case with light-sensitive compositions based on quinone diazides and diazonium salts.

Various light-sensitive, positive-working compositions are known which incorporate an indicator dye to produce the required colour change. Thus, in British patent specification No. 1,039,479, an indicator dye is used in conjunction with an ortho-quinone diazide and in British patent specification No. 1,041,463, an indicator dye is used in conjunction with a diazonium salt.

However, as is well known, the successful development of a positive-working plate depends on the fact that the light-struck areas are more soluble in the developing solvent than the non-light-struck areas, and therefore, the presence of the indicator dye can cause problems unless its solubility in the solvent is compatible with that of the other components of the light-sensitive composition. Thus, if the indicator dye is less soluble than the other components of the light-sensitive composition, it may be left behind after development. This remaining dye could cause staining of the non-image areas which could lead to scumming during printing. On the other hand, if the indicator dye is more soluble than the other components of the light-sensitive composition, it could be dissolved out from the image areas during development, which could weaken the image areas.

The light-sensitive composition of the present invention does not have these disadvantages as the indicator has a solubility which is compatible with the other components of the light-sensitive composition.

According to one aspect of the present invention there is provided a light-sensitive positive-working composition which exhibits a colour change upon exposure to light and which is suitable for the production of a printing plate by a photo-mechanical technique, which composition comprises in admixture a diazonium salt, a novolak resin and an azo-dye which undergoes a colour change in the presence of the light decomposition products of the diazonium salt, said azo-dye being the product obtained by coupling together a diazonium salt and a novolak resin in alkaline medium. Generally, the diazonium salt is a salt of an acid having a dissociation constant above about $1 \times 10^{-3}$. The acid will usually be, but not necessarily, an inorganic acid. The major part of the azo-dye molecule consists of novolak resin and thus it has a similar solubility to the other constituents of the light-sensitive composition.

In use, the light-sensitive composition is applied as a coating to a suitable support, e.g. a conventional zinc, aluminium or bi- or tri-metal support to form a light-sensitive plate. Upon image-wise exposure of the light-sensitive plate, the light-struck areas of the coating undergo a clearly visible colour change due to the reaction of the azo dye with the light-decomposition products of the diazonium salt and hence it can be readily ascertained that the light-sensitive plate has been correctly exposed. Protonation of the azo dye nitrogens by the acid produced by the diazonium salt on exposure to light causes the azo dye to undergo the colour change. Subsequently, the image-wise exposed coating can be processed in conventional manner to obtain a lithographic printing plate. The presence of the azo dye in a quantity adequate to give a marked change of colour does not cause any reduction in the solubility differential between the light-struck and non-light-struck areas.

The term "novolak" is used herein in its conventional sense to mean the alkali and alcohol soluble fusible resin produced by condensing together a phenol having two or more reactive aromatic ring hydrogen positions (such as phenol itself), usually in a slight molar excess, and an aldehyde (such as formaldehyde) or an aldehyde liberating compound capable of undergoing phenol-aldehyde condensation. Any novolak resin conventionally used in the art may be used. Similarly the diazonium salts used are conventional. Examples of suitable diazonium salts are given in the Examples hereinafter described; more can be found in British patent specification No. 944,884.

The amount of azo dye present in the light-sensitive composition is not particularly critical. For example, from 0.1 to 20% by weight (based on the total weight of the composition) may be used. Generally, the greater the amount of azo dye present, the more pronounced is the colour change on exposure to light but it has been found sufficient to use from 0.5 to 2.0% by weight, based on the total weight. The minimum amount of diazonium salt corresponds molecularly to the amount of the azo dye.

If desired, an ortho-quinone diazide may be present in the light-sensitive material. The presence of the ortho-quinone diazide is not essential in order to obtain the required colour change. Nevertheless, it is preferred to include the ortho-quinone diazide since it enhances the lithographic properties of the eventual printing plate. Indeed, the light-sensitive composition may include a relatively large amount of ortho-quinone diazide compared to the amount of diazonium salt since it is possible in this way to provide a light-sensitive composition which is essentially based on an ortho-quinone diazide but which still undergoes an adequate colour change on exposure. Light-sensitive compositions comprising ortho-quinone diazides, usually in admixture with a novolak resin, are used to a large extent in printing plate manufacture but suffer from the disadvantage that they do not ordinarily undergo an adequate colour change on exposure to light.

The azo-dye can be produced by dissolving novolak resin in a solvent containing a suitable base (e.g. ammonia or diethylamine) and then adding diazonium salt. This results in precipitation of the azo-dye which can then be added to a conventional light-sensitive system comprising diazonium salt and novolak resin to produce a light-sensitive composition according to the present invention. Alternatively, the azo-dye may be produced in situ in the light-sensitive diazonium salt-/novolak resin system by adding to the system a small amount of a base to cause a proportion of the diazonium salt and the novolak resin to couple together. In this way, it is not necessary to add the azo-dye as such to the system.

The light-sensitive composition of the present invention has an important advantage over other proposed systems which change colour on exposure in that the non-light-struck areas remaining after development contain the diazonium salt in admixture with novolak resin and constitute an image forming material as is described in U.S. Pat. No. 3,219,447, whereas by other methods, such as those of British patent specification Nos. 1,204,917 and 1,187,814, as well as the previously mentioned British patent specification Nos. 1,041,463 and 1,039,475, the colour changing material is a material foreign to the image-forming material proper and is therefore likely to weaken the printing image. Further, in some processes the image-forming light-sensitive composition is used as a resist, e.g. an etch resist in the case of the production of a bimetallic plate or of a printed circuit sheet. In such cases the acid resistance of the resist may also deteriorate in the presence of a "foreign" material.

The following Examples illustrate the invention.

EXAMPLE 1

12g. of a cresol-based novolak resin known under the trade designation Alnovol 429K, 2g. of diphenylamine-4-diazonium fluoroborate (known under the designation $ZABF_4$ of Fisons Ltd.), 100 ml. acetone, and 100 ml. ethyl methyl ketone were admixed together and 6 ml. of a 1% solution of 0.880 ammonia in acetone were added. The resultant mixture was whirled on to a grained and anodised aluminium sheet at 100 rpm and dried. The resultant light-sensitive plate was exposed to a 4,000 watt xenon lamp for 2½ minutes at 2 feet. Before exposure, the coating was yellow in colour. After image-wise exposure, the light-struck areas were blue in colour and were easily visible in the yellow light of the dark room. The exposed plate was then developed using 1% sodium hydroxide solution. Development was quite satisfactory and no staining of the anodised aluminium sheet occurred. The plate was mounted on a printing press and good copies were produced.

EXAMPLE 2

An electrograined aluminium plate was coated in a whirler with the following formulation: 2,5-diethoxy-4-(4'-tolyl)-mercaptobenzene diazonium borofluoride 4g., PF 402 20g., 0.880 ammonium solution 0.3 ml., acetone 150 ml., ethyl methyl ketone 150 ml.; when the plate was exposed under a positive master for 2 minutes at 2 ft. to a 4000 watt pulsed xenon lamp the exposed areas turned to an intense blue. The plate could be developed with 5% trisodium phosphate (PF 402 is a phenol novolak of I.C.I. Ltd.).

EXAMPLE 3

A similar plate to the above was coated with the following formulation: 2,5-diethoxy-4-(4'-tolyl)-mercaptobenzene diazonium chloride 4g., PF 402 20g., 0.880 ammonia solution 0.3 ml., acetone 150 ml. When the plate was exposed as in Example 2 the same blue colour was produced in the exposed areas but in this case the colour retained its intensity after standing for several days. The plate could be developed with 5% trisodium phosphate.

EXAMPLE 4 a. External Preparation of Azo Dye 12g. of Alnovol 429K was dissolved in 50 ml of 10% NaOH and dropwise, with stirring, 6g. of $ZABF_4$ in 25 ml $H_2O$ were added. After acidification with HCl, the precipitate was filtered off, washed with $H_2O$ till neutral, and dried at 45°C.

b. Use of the Azo Dye in Printing Plate Manufacture 25g of a quinone diazide was added to a solution of 50g novolak resin (Alnovol 429K) in a mixture of 250 ml acetone and 250 ml ethyl methyl ketone. 3g diphenylamine-4-diazonium fluoroborate and 1g of the above azo dye were added to the solution. When dissolution was complete, the resultant solution was whirler coated onto an electrograined and anodised aluminium sheet and dried. The quinone diazide used was 2,3,4-trihydroxy benzophenone mononaphthoquinone-(1,2), diazide-(2)-5-sulphonate made in accordance with British patent specification No. 739,654. On exposure of the resultant light sensitive plate to the light of a carbon arc lamp using a positive, the light struck areas became dark blue in colour and were easily visible in the "dark room" lighting. These areas were alkali developable and, after being processed in conventional manner, the plate performed satisfactorily on a printing machine.

The experiment was repeated using an azo dye prepared in an anologous manner using the phenol novolak PF 402. Similar results were obtained.

EXAMPLE 5

1g of the novolak azo dye prepared from Alnovol 429K and $ZABF_4$ was added to 2g. of 2,4',5-triethoxy diphenyl diazonium oxalate and 10g. of PF 402 novolak in 50 cc. acetone and 50 cc. MEK. The coating was whirled on to an electrograined and anodised aluminium plate and subsequently exposed as described in Example 2. The same blue colour change appeared although in this case it was less intense than that in Examples 1 and 3. The developed plate was almost free of stain in the background areas and showed good adhesion during printing.

EXAMPLE 6

1g. of the novolak azo dye prepared in Example 5 was added to a solution of 12g. Alnovol 429K, 2g. 2,5-diethoxy-4-morpholinobenzene diazonium borofluoride, 4g. of quinone diazide, 100 ml. acetone, 100 ml. ethyl methyl ketone. An electrograined aluminium plate was coated with the above formulation in a whirler and exposed for 2 minutes under a continuous tone step wedge to the light source described in Example 2. The colour change showed that the first six steps had been fully degraded but on development with 10% trisodium phosphate solution only the first step developed clean. When the diazonium salt was replaced with the same weight of 4-diethylaminobenzene diazonium borofluoride the number of steps indicated by the colour change as having degraded was the same as the number of steps which developed out with 10% trisodium phosphate.

The quinone diazide used was the condensation product of naphthoquinone-(1,2)-diazide-(2)-5-sulphonyl chloride and resorcinol monobenzoate produced in accordance with British patent specification No. 1,053,866.

EXAMPLE 7

40g. of Alnovol 429K, 5g. of ZABF, 10g. of the quinone diazide of Example 6, 250 ml. 2-ethoxyethanol and 1.5 ml. 0.880 ammonia were mixed together. The mixture was whirled onto a grained and anodised aluminium sheet and exposed as described in Example 2. The light-struck areas of the coating became blue in colour and were readily distinguished from the non-light-struck areas. The image-wise exposed plate was developed using 5% sodium metasilicate solution. This developer is preferred to sodium hydroxide since it is less injurious to the aluminium background surface. Development was satisfactory and no staining of the anodised surface occurred. The developed plate was mounted on a printing press and many good copies were obtained.

EXAMPLE 8

In two experiments, the coating solutions described in Example 4 were coated on to bimetal plates comprising a chromium plated copper foil laminated to a polyester film base. In each case, exposure under a negative pattern gave a strong blue positive which was developed with alkali leaving a yellow resist image. The chromium which had been laid bare was etched away by application of an hydrochloric acid etch, the resist removed by rubbing with alcohol and the result used as a lithographic plate with a long working life.

EXAMPLE 9

The solubilities of various azo compounds in alkaline developers were compared by adding 0.5 gm of 4-phenylazodiphenylamine (as used in British patent specification No. 1,041,463), 0.5 gm of 2-hydroxy-4-dimethylaminoazobenzene (as described in British patent specification No. 1,039,475) and 0.5 gm of the azo compound of Example 4 separately to 25 ml aliquots of 5% tri-sodium phosphate, 5% sodium metasilicate and Olympic developer. Olympic developer is a proprietory developer of Howson-Algraphy formulated for the development of positive working light sensitive compositions comprising ortho-quinone diazide. Each mixture was stirred for 20 minutes at ambient temperature and then examined. It was found that the 4-phenylazodiphenylamine was completely insoluble in all three developers, that the 2-hydroxy-4-dimethylaminoazobenzene was only partly soluble in all three developers, and that the azo compound of Example 4 was almost completely soluble in all three developers. Clearly, therefore, the 4-phenylazodiphenylamine and the 2-hydroxy-4-dimethylaminoazobenzene are more likely to be left on the non-image areas and cause scumming during printing than the azo compound of Example 4.

I claim:

1. A light-sensitive positive-working composition which exhibits a colour change upon exposure to light and which is suitable for the production of a printing plate by a photomechanical technique, which composition comprises in admixture a diazonium salt, a novolak resin, and an azo-dye which undergoes a colour change in the presence of the light decomposition products of the diazonium salt, said azo-dye being the product obtained by coupling together a diazonium salt and a novolak resin in alkaline medium.

2. A light-sensitive composition as claimed in claim 1, wherein the diazonium salt in the mixture is a diphenylamine-4-diazonium salt.

3. A light-sensitive composition as claimed in claim 2, wherein the diazonium salt in the mixture is diphenylamine-4-diazonium fluoroborate.

4. A light-sensitive composition as claimed in claim 1, wherein the diazonium salt in the mixture is 2,4,5-triethoxy diphenyl diazonium oxalate or 4-diethylamino benzene diazonium fluoroborate.

5. A light-sensitive composition as claimed in claim 1, wherein the diazonium salt from which the azo dye is derived is a diphenylamine-4-diazonium salt, or a 2,5-diethoxy-4-(4′-tolyl)-mercaptobenzene diazonium salt.

6. A light-sensitive composition as claimed in claim 1, which further includes an ortho-naphthoquinone diazide sulphonyl ester.

* * * * *